United States Patent [19]

Moulding

[11] 3,805,194

[45] Apr. 16, 1974

[54] CIRCUIT WIRING ARRANGEMENTS

[75] Inventor: Kenneth William Moulding, Horley, England

[73] Assignee: U.S. Philips Corporation, New York, N.Y.

[22] Filed: Apr. 27, 1972

[21] Appl. No.: 248,300

Related U.S. Application Data

[63] Continuation of Ser. No. 108,420, Jan. 21, 1971, abandoned.

[52] U.S. Cl. .................................. 333/25, 333/84 R

[51] Int. Cl. .............................................. H03h 7/42

[58] Field of Search ........... 333/84 R, 84 M, 26, 25; 321/69; 330/53–56; 329/160–165; 331/117 R, 117 D; 332/43 R, 43 B

[56] References Cited

UNITED STATES PATENTS

| | | | |
|---|---|---|---|
| 3,334,294 | 8/1967 | Lindberg | 333/84 X |
| 2,552,052 | 5/1951 | Mataré | 332/43 B |
| 2,410,006 | 10/1946 | Blitz | 329/164 X |

*Primary Examiner*—Archie R. Borchelt
*Assistant Examiner*—Marvin Nussbaum
*Attorney, Agent, or Firm*—Frank R. Trifari

[57] ABSTRACT

An arrangement for the input and output ports of a two port circuit element comprising a conductor arranged symmetrically between grounded conductors to form a symmetrical balanced circuit coupled to the other port of the element.

3 Claims, 5 Drawing Figures

*INVENTOR.*

KENNETH WILLIAM MOULDING

*BY*

CIRCUIT WIRING ARRANGEMENTS

This is a continuation, of application Ser. No. 108,420, filed Jan. 21, 1971, now abandoned.

This invention relates to input and output circuit wiring arrangements for two-port electric circuit elements.

In the case, for example, of an amplifier working at high gain and/or high frequency capacitance and inductive effects between the output circuit wiring and the input circuit wiring for the amplifier can produce unwanted feedback between the amplifier's output and input circuits.

It is known that such unwanted feedback can be eliminated by using coaxial connections for the input and output circuit wiring. However, it may not always be possible to employ coaxial connections for this purpose; for instance, in the case where an amplifier (or other two-port circuit element) is to be plugged into printed circuit wiring in which is incorporated the input and output circuit wiring for the amplifier.

According to the present invention an input and output circuit wiring arrangement for a two-port circuit element comprises a signal conductor arranged symmetrically between twin earth conductors to form a symmetrical but unbalanced connection for one port of the element, and two signal conductors which form a symmetrical and balanced push-pull connection for the other port of the element.

In carrying out the invention the connection formed by the signal conductor arranged between the twin earth conductors can be for either the input port or the output port of the two-port circuit element with the push-pull connection formed by the two signal conductos for the other port.

As will be described by using an input and output circuit wiring arrangement according to the invention, a symmetrical wiring layout can be realised which effects substantially complete cancellation of both inductive and capacitive feedback between the output circuit wiring and the input circuit wiring for a two-port circuit element.

The invention is particularly (but not exclusively) suited to realization as printed circuit wiring because accuracy in the symmetry of the wiring layout can be readily achieved by known printed circuit wiring techniques.

Figures 1A, 1B, 1C:
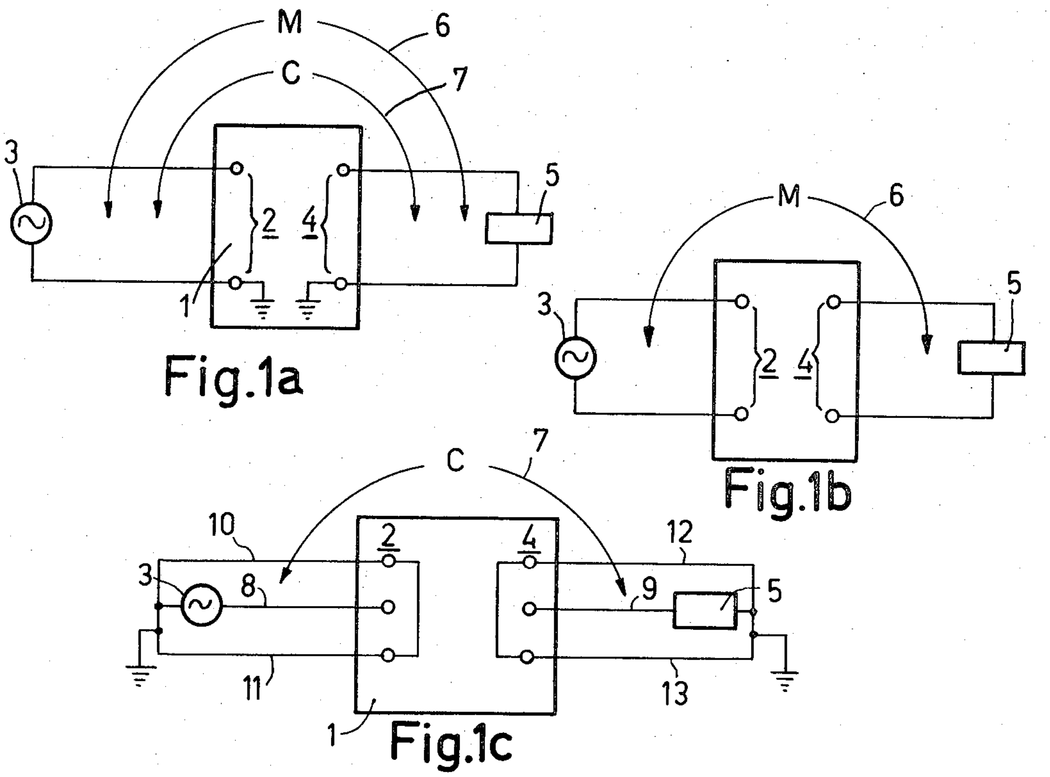
Figure 2:
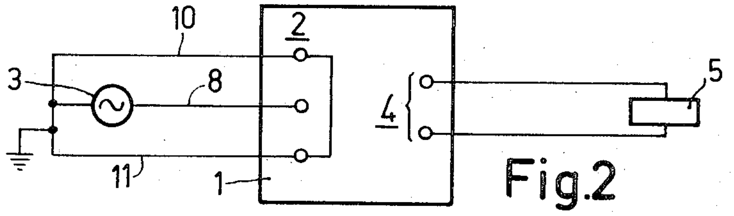
Figure 3:
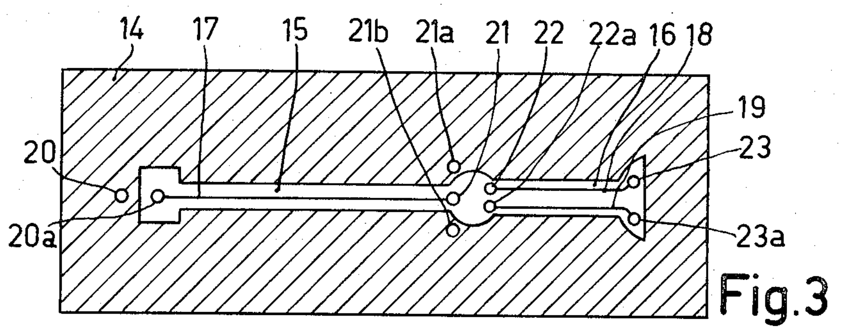

In further considering the nature of the invention reference will now be made by way of example, to the accompanying drawings in which:

FIGS. 1*a*, 1*b* and 1*c* show diagrammatically inown forms of input and output circuit wiring arrangements;

FIG. 2 shows an input and output circuit wiring arrangement according to the invention; and FIG. 3 shows diagrammatically the realization of an input and output circuit wiring arrangement according to the invention as printed circuit wiring.

Referring to the drawings, in FIG. 1*a* a two-port circuit element 1 has an input port 2 to which a source 3 is connected and an output port 4 to which a load 5 is connected. Both the input circuit wiring and the output circuit wiring for the element 1 are asymmetric and unbalanced due to the connection to earth of the lower terminal of each port. As signified by the arrowed lines 6 and 7 such an input and output circuit wiring arrangement can suffer from both capacitive and inductive feedback between the input circuit wiring and the output circuit wiring. The inductive feedback is due to the mutual coupling (M) between the input circuit wiring and the output circuit wiring, and the capacitive feedback (C) is due to the capacitance between the live input wire and the live output wire.

In the arrangement shown in FIG. 1*b*, in which parts corresponding to similar parts in FIG. 1*a* have been given the same reference numerals, the earth connection at the lower terminal of each port has been removed so that both the input circuit wiring and the output circuit wiring is now balanced and symmetrical. Approximately equal capacitances are now present between the conductors of the input and output circuit wiring, the capacitive currents of which are mutually cancelling so that the capacitive feedback is approximately eliminated. However, inductive feedback can still be present due to the mutual coupling (M) between the input circuit wiring and the output circuit wiring.

In the arrangement shown in FIG. 1*c*, in which also parts corresponding to similar parts in FIG. 1*a* have been given the same reference numerals, the input circuit wiring and the output circuit wiring each comprise a signal conductor 8 (or 9) arranged symmetrically between twin earth conductors 10 and 11 (or 12 and 13) to form a symmetrical but unbalanced connection to each port of the two-port circuit element 1. In this arrangement, inductive feedback is approximately eliminated because approximately equal but opposite mutual inductance exists between each input loop and each output loop. However, capacitive feedback can still be present because capacitances between the live input wire and the live output wire are not all mutually cancelling.

Turning now to FIG. 2, the input and output circuit wiring arrangement there shown is in accordance with the present invention and comprises input circuit wiring of the form shown in FIG. 1*c* and output circuit wiring of the form shown in FIG. 1*b*. It has been found that by using such a hybrid arrangement a substantially complete cancellation of both inductive and capacitive feedback is possible. More specifically, the use at one port of the two-port circuit element 1 of circuit wiring comprising a signal conductor arranged symmetrically between twin earth conductors provides for the elimination of inductive feedback by the production of mutually cancelling fluxes, and the use at the other port of circuit wiring comprising symmetrical and balanced push-pull conductors provides for the elimination of capacitive feedback by the production of mutually cancelling capacitances between the conductors of the input and output circuit wiring.

The same effect is achieved with the input and output circuit wiring reversed, that is, with the wiring of the form shown in FIG. 1*b* connected at the input port of the two-port element 1 and the wiring of the form shown in FIG. 1*c* connected at the output port.

FIG. 3 shows a printed circuit wiring layout corresponding to the input and output circuit wiring arrangement of FIG. 2. This printed circuit wiring layout comprises a main earth region 14 which bounds a long narrow slot 15 and a second broader, slot 16. A signal conductor 17 is provided centrally in the slot 15, and two signal conductors 18 and 19 are provided symmetrically in the slot 16 in spaced relationship. Terminal holes 20, 20*a* allow connection of a source (or load) between the earth region 14 and the signal conductor 17, terminal holes 21,21*a* and 21*b* allow connection of the input port (or output port) of a two-port circuit element (e.g., an amplifier) to the earth region 14 and the signal conductor 17 (the connection to the earth region being thus a twin earth connection), terminal holes 22, 22*a* allow connection of the output port (or input port) of the two-port circuit element to the signal conductors 18 and 19, and terminal holes 23, 23*a* allow connection of a load (or source) to the signal conductors 18 and 19. The connection comprising the earth region 14 and the signal conductor 17 will be a symmetrical but unbalanced connection, and the connection comprising the two signal conductors 18 and 19 will be a balanced push-pull connection.

It is mentioned that whereas there is only approximate elimination of capacitive feedback in the arrangement of FIG. 1*b* and only approximate elimination of inductive feedback in the arrangement of FIG. 1*c*, the hybrid use of such arrangements in accordance with the invention results in substantially complete elimination of both capacitive and inductive feedback due to the complete symmetry which can be obtained between the input and output conductors with such a hybrid arrangement.

What we claim is:

1. A connection wiring arrangement for ports of a two-port circuit element having an unbalanced connection to one port and a push-pull connection to the other port, said arrangement comprising an unshielded signal conductor arranged symmetrically between twin grounded conductors to form a symmetrical but unbalanced connection for said one port of the element, and two unshielded signal conductors which form a symmetrical and balanced connection for said other port of the element.

2. A wiring arrangement as claimed in claim 1, wherein said conductors are in the form of printed circuit wiring.

3. A wiring arrangement according to claim 2, comprising a substrate, a grounded surface region on said substrate having first and second reentrant elongated cavities, said first cavity being aligned with said second cavity, a first conductor extending longitudinally along the center of said first cavity to form an unbalanced, symmetrical connection to said one port for suppressing induction, second and third conductors extending longitudinally along said second cavity in a spaced relationship with each other to form a balanced, symmetrical connection to said other port for suppressing capacitance.

* * * * *